(12) United States Patent
Kitano et al.

(10) Patent No.: US 8,722,191 B2
(45) Date of Patent: May 13, 2014

(54) INTERMEDIATE LAYER MATERIAL AND COMPOSITE LAMINATE

(75) Inventors: Hideki Kitano, Tokyo (JP); Haruyuki Hatano, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 729 days.

(21) Appl. No.: 12/281,242

(22) PCT Filed: Feb. 27, 2007

(86) PCT No.: PCT/JP2007/000139
§ 371 (c)(1),
(2), (4) Date: Aug. 29, 2008

(87) PCT Pub. No.: WO2007/099710
PCT Pub. Date: Sep. 7, 2007

(65) Prior Publication Data
US 2009/0017308 A1    Jan. 15, 2009

(30) Foreign Application Priority Data
Mar. 3, 2006 (JP) .................. 2006-058537

(51) Int. Cl.
*B32B 27/38* (2006.01)
*B32B 5/14* (2006.01)
*C08G 59/40* (2006.01)
*H05K 1/03* (2006.01)

(52) U.S. Cl.
USPC .......................... 428/413; 428/414

(58) Field of Classification Search
None
See application file for complete search history.

(56) References Cited

U.S. PATENT DOCUMENTS

| | | | | |
|---|---|---|---|---|
| 5,545,697 A * | 8/1996 | Uchida | ........................ | 525/403 |
| 6,524,717 B1 * | 2/2003 | Takano et al. | ................. | 428/450 |
| 2004/0234741 A1 * | 11/2004 | Hosomi et al. | ............. | 428/292.1 |
| 2005/0277743 A1 * | 12/2005 | Nozaki | ......................... | 525/403 |
| 2006/0216495 A1 * | 9/2006 | Motobe et al. | ................ | 428/323 |
| 2006/0222856 A1 * | 10/2006 | Itou et al. | ...................... | 428/413 |

FOREIGN PATENT DOCUMENTS

| | | | |
|---|---|---|---|
| JP | 60-086120 A | | 5/1985 |
| JP | 61-273948 A | | 12/1986 |
| JP | 06-237055 A | | 8/1994 |
| JP | 2000-191745 | * | 7/2000 |
| JP | 2000-273222 A | | 10/2000 |
| JP | 2000-273238 A | | 10/2000 |
| JP | 2000-344917 A | | 12/2000 |
| JP | 2001-260157 A | | 9/2001 |
| JP | 2002-353581 A | | 12/2002 |
| JP | 2003-078064 A | | 3/2003 |
| JP | 2005-162787 A | | 6/2005 |
| JP | 2005162787 | * | 6/2005 |
| WO | WO2004110115 | * | 12/2004 |
| WO | WO2005007724 | * | 1/2005 |

OTHER PUBLICATIONS

Machine Translation of JP 2005-162787 (2005).*
Mining Engineering, 57(6):57, 2005. http://www.specialtyminerals.com/fileadmin/user_upload/smi/Publications/S-HO-AT-PB-3.pdf.*
Specialty Minerals, http://www.specialtyminerals.com/specialty-applications/special-mineral-functions/fundamentals-of-flexural-modulus-stiffness/ Retrieved on May 25, 2011.*
Gordon England, http://www.gordonengland.co.uk/hardness/mohs.htm Retrieved on May 2005, 2011.*
PCI—Talc Shape and Form Meet Function, Jan 1, 2003. http://www.pcimag.com/articles/talc-shape-and-form-meet-function.*
Komori et al. JP 2000-191745 Machine translation. Jul. 11, 2000.*

* cited by examiner

*Primary Examiner* — Callie Shosho
*Assistant Examiner* — Coris Fung
(74) *Attorney, Agent, or Firm* — Ditthavong Mori & Steiner, P.C.

(57) ABSTRACT

There is provided an intermediate layer material including a curing type resin composition and a fiber base material, to be used to form an intermediate layer of a composite laminate, wherein a cured material obtained by curing the intermediate layer material at a temperature of 180° C. has such properties as (i) a planar linear expansion coefficient ($\alpha1$) equal to or lower than 20 ppm/° C., in a range equal to or higher than 25° C. and equal to or lower than a glass transition temperature (Tg); and (ii) a Barcol hardness equal to or more than 40 and equal to or less than 65, at 25° C.

3 Claims, No Drawings

INTERMEDIATE LAYER MATERIAL AND COMPOSITE LAMINATE

TECHNICAL FIELD

The present invention relates to an intermediate layer material of a laminate, and to a composite laminate including such material.

BACKGROUND ART

For general-purpose type printed circuit boards, a one-sided or double-sided metal clad laminate including a paper fiber base material, an organic fiber base material, or a glass fiber base material is widely employed in numerous fields.

From such metal clad laminate, high planar dimensional stability, and minimal thermal expansion through a heating process in particular, is required for upgrading the connection reliability between the conductor circuit and electronic components formed on the laminate, in addition to excellent punching processability, required when forming a hole for mounting electronic components to be implemented, or when punching a pattern.

Methods for improving the planar dimensional stability of the laminate include employing a material obtained by impregnating a fiber base material with a thermosetting resin composition containing an inorganic filler having a quite small thermal expansion coefficient such as silica, to manufacture the laminate (for example, patent document 1), and employing a special base material such as an alumina-silica fiber cloth, to manufacture the laminate (for example, patent document 2).
[Patent document 1] JP-A No. H06-237055
[Patent document 2] JP-A No. S61-273948

DISCLOSURE OF THE INVENTION

The method that employs the thermosetting resin composition containing the inorganic filler having a small thermal expansion coefficient allows improving the dimensional stability of the laminate thereby obtained.

The inorganic filler such as silica has, however, high hardness, which leads to the drawback that the laminate gains a large elastic modulus, and hence processing performance of a punching process is degraded.

Besides, employing a special base material to thereby manufacture the laminate does not always provide a beneficial result, in terms of cost and versatility.

In view of such background, the present invention provides an intermediate layer material that can form a laminate having excellent punching processability and planar dimensional stability, and a laminate including such material.

The foregoing object is achieved by the present invention (1) to (11) cited here below.

(1) An intermediate layer material comprising a curing type resin composition and a fiber base material, to be used to form an intermediate layer of a composite laminate, wherein a cured material obtained by curing the intermediate layer material at a temperature of 180° C. has such properties as:
(i) a planar linear expansion coefficient ($\alpha 1$) equal to or lower than 20 ppm/° C., in a range equal to or higher than 25° C. and equal to or lower than a glass transition temperature (Tg); and
(ii) a Barcol hardness equal to or more than 40 and equal to or less than 65, at 25° C.

(2) The intermediate layer material according to (1) above, wherein the curing type resin composition contains (a) a curing type resin and (b) an inorganic filler.
(3) The intermediate layer material according to (2) above, wherein the (a) curing type resin contains an epoxy resin and a phenolic resin.
(4) The intermediate layer material according to (2) above, containing equal to or more than 50 wt. % and equal to or less than 80 wt. % of the (b) inorganic filler, with respect to an entirety of a solid content in the curing type resin composition.
(5) The intermediate layer material according to (2) above, wherein the (b) inorganic filler includes an inorganic filler of a layered structure.
(6) The intermediate layer material according to (2) above, containing equal to or more than 50 wt. % and equal to or less than 100 wt. % of the inorganic filler of a layered structure, with respect to an entirety of the (b) inorganic filler.
(7) The intermediate layer material according to (5) above, wherein the inorganic filler of a layered structure has a Mohs hardness equal to or smaller than 4.
(8) The intermediate layer material according to (5) above, wherein the inorganic filler of a layered structure has an aspect ratio of equal to or greater than 3.
(9) The intermediate layer material according to (5) above, containing talc as the inorganic filler of a layered structure.
(10) A composite laminate formed through stacking one or more of the intermediate layer materials according to (1) above, superposing one or more surface layers over both front and back sides of the stacked intermediate layer materials; and curing the structure thus formed.
(11) The composite laminate according to (10) above, having such properties as:
(iii) a planar linear expansion coefficient ($\alpha 1$) equal to or lower than 20 ppm/° C., in a range equal to or higher than 25° C. and equal to or lower than a glass transition temperature (Tg); and
(iv) an elastic modulus equal to and higher than 8,000 MPa and equal to or lower than 20,000 MPa, at 25° C.

The present invention provides an intermediate layer material applicable to a laminate required to have excellent punching processability and planar dimensional stability.

Also, the laminate obtained with the intermediate layer material according to the present invention is suitably applicable, despite being inexpensive, to a printed circuit board required to have high processability and connection reliability.

BEST MODE FOR CARRYING OUT THE INVENTION

Hereunder, an intermediate layer material and a laminate according to the present invention will be described in details.

The intermediate layer material according to the present invention is:

An intermediate layer material comprising a curing type resin composition and a fiber base material, to be used to form an intermediate layer of a composite laminate, wherein a cured material obtained by curing the intermediate layer material at a temperature of 180° C. has such properties as: (i) a planar linear expansion coefficient ($\alpha 1$) equal to or lower than 20 ppm/° C., in a range equal to or higher than 25° C. and equal to or lower than a glass transition temperature (Tg); and (ii) a Barcol hardness equal to or more than 40 and equal to or less than 65, at 25° C.

First, the curing type resin composition employed in the intermediate layer material according to the present invention will be described.

The curing type resin composition preferably applicable to the present invention contains a curing type resin and an inorganic filler.

The curing type resin can be exemplified by the following thermosetting resins. Namely, a phenolic resin, an epoxy resin, a cyanate ester resin, a urea resin, a melamine resin, an unsaturated polyester resin, a bismaleimide resin, a polyurethane resin, a diallylphthalate resin, a silicone resin, and a resin containing a benzooxazine ring can be cited.

Examples of the phenolic resin include novolak phenolic resins such as a phenol novolak resin, a cresol novolak resin, and a bisphenol-A novolak resin; and resol phenolic resins such as a methylol resol resin, a dimethylene ether resol resin, and oil-modified resol phenolic resins modified by tung oil, linseed oil, or walnut oil. One or a combination of at least two of those may be employed.

Regarding the epoxy resin, any compound is applicable provided that the compound contains two or more epoxy groups in a molecule, and examples thereof include bisphenol epoxy resins such as a bisphenol-A epoxy resin, a bisphenol-F epoxy resin, a bisphenol-AD epoxy resin; novolak epoxy resins such as a phenol novolak epoxy resin and a cresol novolak epoxy resin; brominated epoxy resins such as a brominated bisphenol-A epoxy resin and a brominated phenol novolak epoxy resin; heterocyclic epoxy resins such as a triglycidyl isocyanate; and also an alicyclic epoxy resin, a biphenyl epoxy resin, a naphthalene epoxy resin, a glycidyl ester epoxy resin, and an arylalkylene epoxy resin. One or a combination of at least two of those may be employed.

Examples of the cyanate ester resin include the one obtained from reacting a halo-cyanate and a phenol, and a prepolymerized compound thereof obtained by heating or the like. Examples of the specific form include bisphenol cyanate resins such as a novolak cyanate resin, a bisphenol-A cyanate resin, a bisphenol-E cyanate resin, and a tetramethyl bisphenol-F cyanate resin. One or a combination of at least two of those may be employed.

In the case of employing the foregoing thermosetting resin, a curing agent or an accelerator may be added as the case may be.

For example, in the case of employing a phenolic resin as the thermosetting resin, hexamethylenetetramine or the like, or a formaldehyde source such as paraformaldehyde may be employed.

In the case of employing an epoxy resin as the thermosetting resin, an addition type curing agent, a catalytic curing agent, and a condensed curing agent may be applied.

Examples of the addition type curing agent include aliphatic polyamines such as diethylene triamine (DETA), triethylene tetraamine (TETA), and metaxylylenediamine (MXDA); aromatic polyamines such as diaminodiphenylmethane (DDM), m-phenylenediamine (MPDA), and diaminophenylsulfone (DDS); polyamine compounds such as dicyan diamide (DICY) and organic acid dihydrazide; alicyclic anhydrides such as hexahydrophthalic anhydride (HHPA) and methyltetrahydrophthalic anhydride (MTHPA); anhydrides containing an aromatic anhydride such as trimellitic anhydride (TMA), pyromellitic anhydride (PMDA), and benzophenone tetracarboxylic acid (BTDA); polyphenol compounds such as a novolak phenolic resin and a phenol polymer; polymercaptan compounds such as polysulfide, thioester, and thioether; isocyanate compounds such as an isocyanate prepolymer and blocked isocyanate; and organic acids such as carboxylic acid-containing polyester resin.

Examples of the catalytic curing agent include tertiary amine compounds such as benzyldimethylamine (BDMA) and 2,4,6-tridimethyl aminomethylphenol (DMP-30); imidazole compounds such as 2-methylimidazole and 2-ethyl-4-methylimidazole (EMI 24); and Lewis acids such as $BF_3$ complex.

Examples of the condensed curing agent include phenolic resins such as a novolak phenolic resin and a resol phenolic resin; urea resins such as a methylol group-containing urea resin; and melamine resins such as a methylol group-containing melamine resin.

The curing type resin may contain, for example, an epoxy resin and a phenolic resin. Such composition facilitates obtaining an intermediate layer material having high dimensional stability and processability.

Examples of the inorganic filler applicable to the present invention include silicic acid salts such as talc, fired clay, unfired clay, mica, and glass; oxides such as titan oxide, alumina, silica, and molten silica; carbonate salts such as calcium carbonate, magnesium carbonate, and hydrotalcite; sulfite salts or sulfate salts such as aluminum hydroxide, calcium sulfate and calcium sulfite; borate salts such as zinc borate, barium metaborate, aluminum borate, calcium borate, and sodium borate; and nitrides such as aluminum nitride, boron nitride, and silicon nitride. One or a combination of at least two of those may be employed.

It is preferable to employ an inorganic filler having a layered structure, as the foregoing inorganic filler.

In this case the curing type resin component can penetrate into between the layers of the layered structure, and hence the planar friction resistance at the contact interface between the inorganic filler and the curing type resin component can be increased, once the resin composition is cured. Also, even though the layered structure is cleaved into plates, the shape allows increasing the planar friction resistance at the contact interface between the inorganic filler and the curing type resin component. Such effects contribute to upgrading the planar dimensional stability of the laminate.

Examples of the inorganic filler of a layered structure include talc and micas such as muscovite, phlogopite, fluorophlogopite, and tetrasilicic mica.

It is preferable that the inorganic filler of a layered structure has a Mohs hardness equal to or smaller than 4. Such property allows reducing the elastic modulus of the laminate, and improving punching processability thereof.

More preferably, the Mohs hardness is equal to or less than 1.5. In this case, the punching processability can be further upgraded.

Examples of the inorganic filler having such Mohs hardness include talc (1 to 1.5), micas such as muscovite (2.0 to 3.0), phlogopite (2.0 to 3.0), fluorophlogopite (3.4), and tetrasilicic mica (3.0).

It is preferable that the inorganic filler of a layered structure has an aspect ratio equal to or greater than 3.

Such configuration allows further upgrading the dimensional stability of the laminate.

The aspect ratio herein refers to a ratio of the planar longitudinal dimension of the inorganic filler of a layered structure, with respect to the thicknesswise dimension thereof (planar longitudinal dimension/thicknesswise dimension). Here, the thicknesswise dimension may be taken either before or after the inorganic filler of a layered structure is cleaved.

The upper limit of the aspect ratio is not specifically limited, however may normally be determined as approximately 3,000.

It is preferable that the curing type resin composition employed in the present invention contains the inorganic filler in a proportion of 50 to 80 wt. %, and more preferably 60 to 80 wt. %, with respect to the entire solid content in the curing type resin composition. Such composition allows enhancing the improving effect of the dimensional stability. Here, the solid content in the curing type resin composition refers to the total of the solid content excluding the solution portion of the curing type resin component and the inorganic filler.

Insufficient application of the inorganic filler may lead to unsatisfactory improvement of the dimensional stability. On the other hand, excessive application of the inorganic filler leads to lowered work efficiency in preparing the curing type resin composition.

It is preferable that the curing type resin composition employed in the present invention contains 50 to 100 wt. %, and more preferably 70 to 100 wt. % of inorganic filler of a layered structure, with respect to the entire inorganic filler. Also, it is preferable that the curing type resin composition contains 30 to 80 wt. %, and more preferably 60 to 80 wt. % of inorganic filler of a layered structure, with respect to the entirety of the curing type resin composition. Such composition allows enhancing the improving effect of the dimensional stability.

Insufficient application of the inorganic filler of a layered structure may lead to unsatisfactory improvement of the dimensional stability.

The curing type resin composition according to the present invention may contain, in addition to the curing type resin, the curing agent, the accelerator, and the inorganic filler described above, a thermoplastic resin such as a phenoxy resin, polyethersulfone, or polyphenylenesulfide; and a plasticizer, a pigment, a surface treatment agent or the like, as the case may be.

Examples of the surface treatment agent include coupling agents such as an epoxy silane coupling agent, a titanate-based coupling agent, an amino silane coupling agent, and a silicone oil coupling agent, as well as a curing type resin component employed in the composition.

A method of preparing the curing type resin composition employed in the present invention will now be described.

The curing type resin composition employed in the present invention may be prepared, for example, through mixing the curing type resin, the curing agent, and the accelerator described above, or dissolving or dispersing the same in a soluble or dispersible solvent, adding the inorganic filler, and then mixing and dispersing the composition with a mixing equipment, dispersing equipment or the like.

It is preferable that the curing type resin composition is prepared in a liquid form. Such form allows better impregnation of the fiber base material with the composition.

When preparing the curing type resin composition according to the present invention by the foregoing method, it is preferable that the inorganic filler is subjected to a surface treatment process, before mixing the inorganic filler and the curing type resin component (or the solvent solution or dispersion solution of the curing type resin component). In particular, it is preferable to apply the surface treatment to the inorganic filler of a layered structure.

Such arrangement allows preventing, when adding the inorganic filler of a layered structure to the curing type resin component and mixing them, the curing type resin component from quickly penetrating into between the layers of the inorganic filler of a layered structure, which leads to excessively high viscosity of the overall curing type resin composition, thereby resulting in degraded mixing accuracy and mixing work efficiency.

Also, even though the inorganic filler of a layered structure is cleaved because of a shearing force imposed by the mixing equipment or dispersing equipment after the inorganic filler is added to the curing type resin component, the excessive increase in viscosity of the composition can be prevented, which allows preparing the curing type resin composition of an accurate mixing ratio and easy to handle.

Further, applying the foregoing surface treatment increases the affinity with the curing type resin component, thereby achieving the improvement in mechanical characteristic, heat resistance (especially solder heat resistance after moisture absorption), and dimensional stability.

The fiber base material employed in the intermediate layer material according to the present invention will now be described.

The fiber base material employed in the intermediate layer material according to the present invention is not specifically limited, but can be exemplified by a glass fiber base material such as a glass woven cloth or a glass non-woven cloth; an inorganic fiber woven or non-woven cloth containing an inorganic compound other than glass as the component; and an organic fiber base material composed of an organic fiber such as a polyamide resin, an aromatic polyamide resin, a polyester resin, an aromatic polyester resin, a polyimide resin, or a fluorine resin.

Among the foregoing, the glass fiber base materials are preferable because of small linear expansion coefficient, low cost, high mechanical strength, and low moisture absorption, and the glass fiber non-woven cloth is particularly preferable, because this allows improving the punching processability.

A preferable range of the weight in gsm of the glass fiber non-woven cloth to be herein employed is, for example, 30 to 150 g/m$^2$.

The intermediate layer material according to the present invention can be manufactured through impregnating the foregoing fiber base material with the curing type resin composition, and executing a heat treatment process.

Methods of impregnating the fiber base material with the curing type resin composition include, for example, soaking the fiber base material in the curing type resin composition, applying the curing type resin composition to the fiber base material with a spraying equipment such as a sprayer, and coating the fiber base material with the curing type resin composition with a coating equipment such as a comma coater or a knife coater.

Such methods may be appropriately selected according to the nature of the curing type resin composition and the fiber base material, the amount of the curing type resin composition to be applied to the fiber base material, and so forth.

After impregnating the fiber base material with the curing type resin composition, executing the heat treatment, or drying for removal in the case where a solvent is employed when preparing the curing type resin composition, improves the handling performance of the intermediate layer material. Also, the curing reaction of the curing type resin component may be executed halfway as the case may be, so as to adjust the resin fluidity for manufacturing the laminate.

The heat treatment may be executed, for example, at 120 to 220° C. for a duration of 30 to 180 minutes.

The intermediate layer material according to the present invention provides the advantageous effect of improving the processability and dimensional stability of the laminate thereby obtained, because the cured material obtained by curing the intermediate layer material has such properties as (i) the planar linear expansion coefficient ($\alpha 1$) equal to or lower than 20 ppm/° C., in a range equal to or higher than 25° C. and equal to or lower than a glass transition temperature (Tg), and (ii) the Barcol hardness equal to or more than 40 and equal to or less than 65, at 25° C.

Specific methods of satisfying the (i) and (ii) above include appropriately combining specific types of curing type resin and inorganic filler, for example properly combining an epoxy resin as the curing type resin and talc which has a Mohs hardness not exceeding 4, and an aspect ratio not less than 3, as the inorganic filler.

The cured material, obtained by curing the intermediate layer material according to the present invention at a temperature of 180° C., has (i) the planar linear expansion coefficient ($\alpha 1$) equal to or lower than 20 ppm/° C., in a range equal to or higher than 25° C. and equal to or lower than a glass transition temperature (Tg). The lower limit is not specifically determined, but preferably 0 ppm/° C. to 20 ppm/° C., and more preferably 15 to 18 ppm/° C.

Thus, setting the linear expansion coefficient of the cured intermediate layer material so as not to exceed 20 ppm/° C. in the above range allows reducing the linear expansion coefficient of the laminate, thereby facilitating obtaining a composite laminate from which a circuit board having high connection reliability with electronic components can be manufactured.

The linear expansion coefficient can be measured with a thermal mechanical analysis (TMA) equipment, according to the method stipulated under JIS K-7197. To be more detailed, the cured intermediate layer material is prepared as the measurement specimen and set on the stage of the equipment, and heated up the specimen at a constant speed under a predetermined load, so that the amount of expansion is detected in a form of an electrical output by a differential transformer, and that the coefficient is thereby calculated based on the relationship with the temperature.

The cured intermediate layer material means that the reaction of the functional group of the curing type resin component in the curing type resin composition constituting the intermediate layer material has substantially been completed therein, which can be evaluated, for example, by measuring the heat generation with a differential scanning calorimeter (DSC) and, specifically, the cured state corresponds to the state where the heat generation is barely detected.

As the condition for obtaining such cured state of the intermediate layer material, it is preferable to execute the treatment, for example, at 120 to 220° C. and for a duration of 30 to 180 minutes, and more preferably at 150 to 200° C. and for a duration of 45 to 120 minutes.

Also, the cured material, obtained by curing the intermediate layer material according to the present invention at a temperature of 180° C., has (ii) the Barcol hardness equal to or more than 40 and equal to or less than 65, at 25° C.

Preferably, the Barcol hardness is not less than 45 and not exceeding 65. Such hardness improves the processability in punching the laminate, thereby preventing emergence of a crack upon punching, and gives necessary and sufficient mechanical strength to the laminate. More preferably, the Barcol hardness is not less than 50 and not exceeding 65. Such hardness further upgrades the punching processability.

The Barcol hardness can be measured with a Barcol hardness meter according to JIS K961146-52, at a temperature not exceeding 25° C.

Methods of obtaining the intermediate layer material having the foregoing thermal expansion coefficient and elastic modulus include, for example, appropriately adjusting the mixing ratio of the curing type resin component and the inorganic filler, properly employing the inorganic filler of a layered structure and adjusting the mixing ratio thereof, properly employing the fiber base material having a small linear expansion coefficient, and so forth.

Now, the composite laminate according to the present invention will be described.

The composite laminate according to the present invention is made through stacking one or more of the intermediate layer materials according to the present invention, superposing one or more surface layers over both front and back sides of the stacked intermediate layer materials; and curing the same.

As the surface layer material herein employed, a fiber base material for the surface layer material, impregnated with a curing type resin composition for the surface layer material and dried, may be preferably employed.

The fiber base material employed in the surface layer material can be exemplified by a glass fiber base material such as a glass woven cloth or a glass non-woven cloth; an inorganic fiber woven or non-woven cloth containing an inorganic compound other than glass as the component; and an organic fiber base material composed of an organic fiber such as a polyamide resin, an aromatic polyamide resin, a polyester resin, an aromatic polyester resin, a polyimide resin, or a fluorine resin.

Among the foregoing, the glass fiber base materials are preferable because of small linear expansion coefficient, low cost, high mechanical strength, and low moisture absorption, and the glass fiber woven cloth is particularly preferable, because this gives sufficient mechanical strength to the composite laminate.

A preferable range of the weight in gsm of the glass fiber woven cloth to be herein employed is, for example, 50 to 250 g/m$^2$.

Also, it is preferable to employ a curing type resin composition containing a thermosetting resin, for the surface layer material. Examples of the thermosetting resin include a phenolic resin, an epoxy resin, a cyanate ester resin, a urea resin, a melamine resin, an unsaturated polyester resin, a bismaleimide resin, a polyurethane resin, a diallylphthalate resin, a silicone resin, and a resin containing a benzooxazine ring.

Regarding the individual thermosetting resin and curing agent to be employed therewith, those described in the paragraph of the curing type resin composition for the intermediate layer material may be similarly applied.

Further, apart from the above, the curing type resin composition for the surface layer material may also contain a thermoplastic resin, a plasticizer, a pigment, a surface treatment agent, an inorganic filler, and so forth.

For example, adding an inorganic filler to the curing type resin composition for the surface layer material enhances the tracking resistance of the laminate.

The surface layer material for the composite laminate according to the present invention can be manufactured through impregnating the foregoing fiber base material for the surface layer with the curing type resin composition for the surface layer, and executing a heat treatment process.

Methods of impregnating the fiber base material with the curing type resin composition include, for example, soaking the fiber base material in the curing type resin composition, applying the curing type resin composition to the fiber base material with a spraying equipment such as a sprayer, and coating the fiber base material with the curing type resin composition with a coating equipment such as a comma coater or a knife coater.

Such methods may be appropriately selected according to the nature of the curing type resin composition and the fiber base material, the amount of the curing type resin composition to be applied to the fiber base material, and so forth.

After impregnating the fiber base material with the curing type resin composition, executing the heat treatment, or drying for removal in the case where a solvent is employed when preparing the curing type resin composition, improves the handling performance of the surface layer material. Also, the curing reaction of the curing type resin component may be executed halfway as the case may be, so as to adjust the resin fluidity for manufacturing the laminate.

The heat treatment may be executed, for example, at 120 to 200° C. for a duration of 1 to 10 minutes.

The composite laminate according to the present invention is made through curing the structure including the intermediate layer material and the surface layer material according to the present invention stacked on each other, however a metal foil such as a copper foil may be applied to one or both sides over the above structure before being cured, so as to form a metal clad composite laminate.

To make a laminate from the above structure, for example a method of heat-pressing process at 150 to 250° C., for 30 to 180 minutes, and under 0.5 to 10 MPa may be applied.

The composite laminate according to the present invention has:

(iii) a planar linear expansion coefficient ($\alpha 1$) equal to or lower than 20 ppm/° C., in a range equal to or higher than 25° C. and equal to or lower than a glass transition temperature (Tg). More preferably, the planar linear expansion coefficient ($\alpha 1$) is 15 to 18 ppm/° C.

The linear expansion coefficient of the composite laminate can be measured in the same way as measuring that of the cured intermediate layer material.

Setting the linear expansion coefficient of the composite laminate in the foregoing range allows reducing a difference in linear expansion between the circuit board and the electronic components through the heat treatment subsequent to the implementation of the electronic components (for example, the reflow mounting or flow mounting), thereby securing the connection reliability between the conductor circuit on the circuit board and the electronic components.

Also, the composite laminate according to the present invention has:

(iv) then elastic modulus equal to and higher than 8,000 MPa and equal to or lower than 20,000 MPa, preferably 10,000 to 18,000 MPa, and more preferably 10,000 to 15,000 MPa, at 25° C.

The elastic modulus of the composite laminate can be measured according to JIS C6481.

Setting the elastic modulus of the composite laminate in the above range allows reducing the punching resistance in the punching process of the circuit board, while giving sufficient mechanical strength to the laminate, thereby preventing emergence of a crack at the punched point due to the punching action. This improves the punching work efficiency. Also, the processing yield of the circuit board can be improved and the life span of the processing tools such as a drill can be extended, so that the manufacturing cost of the circuit board can be reduced.

EXAMPLES

Hereunder, the present invention will be described based on examples and comparative examples, however the present invention is not limited to the forms exemplified below.

1. Materials

The materials employed in the examples according to the present invention and the comparative examples are as specified below.

(1) Epoxy resin 1: Brominated bisphenol-A epoxy resin, Art. No. 153 from DIC Corporation, epoxy equivalent 400

(2) Epoxy resin 2: Bisphenol-A epoxy resin, Art. No. 850 from DIC Corporation, epoxy equivalent 190

(3) Curing agent: Novolak phenolic resin, Art. No. PR-51470 from Sumitomo Bakelite Co., Ltd.

(4) Accelerator: 2-methylimidazole (5) Inorganic filler 1: Talc, Art. No. PKP-53 from Fuji Talc Industrial Co., Ltd., aspect ratio 10, Mohs hardness 1, particle diameter 18 μm (6) Inorganic filler 2: Mica, from CO—OP Chemical Co., Ltd., aspect ratio 10, Mohs hardness 3

(7) Inorganic filler 3: Silica, from Admatechs Co., Ltd., Mohs hardness 7

(8) Surface treatment agent: Epoxy silane coupling agent, from Shin-Etsu Chemical Co., Ltd.

2. Preparing the Curing Type Resin Composition for the Intermediate Layer Material 2.1 Preparing the Curing Type Resin Composition 1 for the Intermediate Layer Material 55 wt. part of the epoxy resin 1, 20 wt. part of the epoxy resin 2, 25 wt. part of the curing agent and 0.1 wt. part of the accelerator were mixed, and the mixture was dissolved in methylcellosolve, to thereby prepare a curing type resin solution having a solid content concentration of 60 wt. %.

Apart from the above, 2 wt. part of the surface treatment agent was applied to 100 wt. part of the inorganic filler 1, and a surface treatment process was executed utilizing a high-speed mixer, to thereby prepare the inorganic filler 1.

180 wt. part of the surface-treated inorganic filler 1 was mixed with 100 wt. part of the curing type resin solution (solid content), and mixed in a disperser at 1,000 rpm for 30 minutes, to thereby prepare the curing type resin composition 1 for the intermediate layer material.

2.2 Preparing the Curing Type Resin Composition 2 for the Intermediate Layer Material The same procedure was taken as 2.1 above, except that 150 wt. part of the surface-treated inorganic filler 1 was mixed with 100 wt. part of the curing type resin solution (solid content), to thereby prepare the curing type resin composition 2 for the intermediate layer material.

2.3 Preparing the Curing Type Resin Composition 3 for the Intermediate Layer Material The same procedure was taken as 2.1 above, except that 230 wt. part of the surface-treated inorganic filler 1 was mixed with 100 wt. part of the curing type resin solution (solid content), to thereby prepare the curing type resin composition 3 for the intermediate layer material.

2.4 Preparing the Curing Type Resin Composition 4 for the Intermediate Layer Material The same procedure was taken as 2.1 above, except that 50 wt. part each of the inorganic filler 1 and the inorganic filler 2 were employed instead of 100 wt. part of the inorganic filler 1, to thereby prepare the curing type resin composition 4 for the intermediate layer material.

2.5 Preparing the Curing Type Resin Composition 5 for the Intermediate Layer Material The same procedure was taken as 2.1 above, except that 100 wt. part of the inorganic filler 3 was employed instead of 100 wt. part of the inorganic filler 1, to thereby prepare the curing type resin composition 5 for the intermediate layer material.

3. Making Up the Intermediate Layer Material

3.1 [Example 1]

A glass fiber non-woven cloth (Art. No. EPM from Cumulass Co., Ltd., 50 g/m$^2$) was employed as the fiber base material for the intermediate layer material.

Utilizing a popular application and impregnation equipment, 100 g of the glass fiber non-woven cloth was impregnated with 1,000 g of the curing type resin composition 1 for the intermediate layer material in terms of solid content, and dried in a dryer at 150° C. for 5 minutes, to thereby make up the intermediate layer material 1.

3.2 [Example 2]

The same procedure was taken as the example 1, except that the curing type resin composition 2 for the intermediate layer material was employed instead of the curing type resin composition 1 for the intermediate layer material, to thereby make up the intermediate layer material 2.

3.3 [Example 3]

The same procedure was taken as the example 1, except that the curing type resin composition 3 for the intermediate layer material was employed instead of the curing type resin composition 1 for the intermediate layer material, to thereby make up the intermediate layer material 3.

3.4 [Example 4]

The same procedure was taken as the example 1, except that the curing type resin composition 4 for the intermediate layer material was employed instead of the curing type resin composition 1 for the intermediate layer material, to thereby make up the intermediate layer material 4.

3.5 [Comparative Example 1]

The same procedure was taken as the example 1, except that the curing type resin composition 5 for the intermediate layer material was employed instead of the curing type resin composition 1 for the intermediate layer material, to thereby make up the intermediate layer material 5. The intermediate layer material 5 is a material predominantly composed of silica, which has conventionally been employed.

4. Preparing the Curing Type Resin Composition for the Surface Layer Material 55 wt. part of the epoxy resin 1, 20 wt. part of the epoxy resin 2, 25 wt. part of the curing agent and 0.1 wt. part of the accelerator were mixed, and the mixture was dissolved in methylcellosolve, to thereby prepare a curing type resin solution for the surface layer material, having a solid content concentration of 60 wt. %.

5. Making Up the Surface Layer Material

A glass fiber woven cloth (from Nitto Boseki Co., Ltd., 180 g/m$^2$) was employed as the fiber base material for the surface layer material.

Utilizing a popular application and impregnation equipment, 100 g of the glass fiber woven cloth was impregnated with 250 g of the curing type resin composition for the surface layer material in terms of solid content, and dried in a dryer at 150° C. for 2 minutes, to thereby make up the surface layer material.

6. Making Up the Laminate

Four sheets of the intermediate layer materials obtained from the example 1 to 4 and the comparative example 1 were stacked. One sheet each of the surface layer material was superposed over both front and back sides of the intermediate layer materials, and one sheet each of electrolytic copper foil (Art. No. GTS-MP-18 from Furukawa Circuit Foil Co., Ltd.) of 18 μm in thickness was superposed over both front and back sides of the same.

Such structure was heated up from the room temperature to a peak of 180° C. and heat-pressed under 4 MPa for 60 minutes, in a vacuum press forming equipment depressurized by 740 Torr from the atmospheric pressure, to thereby make up the composite laminate.

7. Evaluation

7.1 Evaluation of the Intermediate Layer Material (1) Linear Expansion Coefficient The intermediate layer material was heat-pressed at 180° C. under 4 MPa, to thereby obtain the cured intermediate layer material.

Utilizing the cured material as the specimen, the linear expansion coefficient was measured in two directions, with a thermal mechanical analysis (TMA) equipment according to the method stipulated under JIS K7197. The glass transition temperature (Tg) was 105 to 145° C.

The measurement condition was as follows:
Load: 0.1 N
Heating speed: 10° C./min.

(2) Barcol Hardness

The Barcol hardness was measured with respect to the specimen employed in (1) above, by the method according to JIS K6911 46-52.

7.2 Evaluation of the Laminate (1) Linear Expansion Coefficient

The specimen was prepared by removing the copper foil from the laminate obtained as above, by an overall etching process on both sides, and the linear expansion coefficient was measured in two directions, with a thermal mechanical analysis (TMA) equipment according to the method stipulated under JIS K7197.

The measurement condition was as follows:
Load: 0.1 N
Heating speed: 10° C./min.

(2) Elastic Modulus

The same specimen as (1) was employed, and the elastic modulus was measured by the method according to JIS C6481.

(3) Punching Processability

The same specimen as (1) was employed, and the punching processability was measured by the method described below Table 1 exhibited hereunder.

(4) Connection Reliability

The connection reliability was measured by the method described below Table 1 exhibited hereunder.

The result of the foregoing evaluation is shown in Table 1.

TABLE 1

| SUBJECT OF EVALUATION | EVALUATION ITEM | UNIT | EXAMPLE 1 | EXAMPLE 2 | EXAMPLE 3 | EXAMPLE 4 | COMPARATIVE EXAMPLE 1 |
|---|---|---|---|---|---|---|---|
| INTERMEDIATE MATERIAL | LINEAR EXPANSION COEFFICIENT | ppm/° C. | 16 | 18 | 16 | 18 | 20 |
| | BARCOL HARDNESS | — | 56 | 55 | 57 | 60 | 68 |
| LAMINATE | LINEAR EXPANSION COEFFICIENT | ppm/° C. | 17 | 19 | 17 | 19 | 21 |
| | ELASTIC MODULUS | MPa | 15000 | 13000 | 17000 | 15000 | 21000 |
| | PUNCHING PROCESSABILITY | — | GOOD | GOOD | GOOD | GOOD | POOR |
| | CONNECTION RELIABILITY | — | GOOD | GOOD | GOOD | GOOD | GOOD |

Punching Processability:

Punching press was executed at 150 tons with a tooling having 20 holes of 1 mm in diameter aligned at an interval of 2 mm, on a specimen of 150 mm×150 mm, and the punched specimen was removed from the tooling for evaluating the appearance of the positions corresponding to the holes.

GOOD: No whitening or crack around the punched point
POOR: Crack observed around the punched point Connection Reliability:

A circuit board with a resistance 2125 mounted thereon was subjected to a temperature/humidity cycle test (2000 cycles).

GOOD: No disconnection
POOR: Disconnection incurred

8. Observation

The examples 1 to 4 represent the intermediate layer material according to the present invention, and have proved to have a small linear expansion coefficient, high planar dimensional stability, and the Barcol hardness in the preferable range. The composite laminate containing such intermediate layer material has proved to have excellent punching processability, as well as high planar dimensional stability and high connection reliability, because of the small linear expansion coefficient.

The comparative example 1 is the intermediate layer material containing a large amount of silica, and has a high elastic modulus, though the linear expansion coefficient thereof is small. As a result, the composite laminate containing such intermediate layer material has proved to be inferior in punching processability, though the connection reliability thereof is satisfactory.

The invention claimed is:

1. An intermediate layer material comprising a curable resin composition and a fiber base material, to be used to form an intermediate layer of a composite laminate,
wherein said curable resin composition contains (a) a curable resin and (b) an inorganic filler comprising talc, containing equal to or more than 60 wt. % and equal to or less than 80 wt. % of said (b) inorganic filler, with respect to an entirety of a solid content in said curable resin composition,
wherein a cured material obtained by curing said intermediate layer material at a temperature of 180° C. has such properties as:
(i) a planar linear expansion coefficient (α1) equal to or lower than 20 ppm/° C., in a range equal to or higher than 25° C. and equal to or lower than a glass transition temperature (Tg); and
(ii) a Barcol hardness equal to or more than 40 and equal to or less than 65, at 25° C., wherein an amount of the talc is being equal to or more than 50 wt. % and equal to or less than 100 wt. % with respect to an entirety of said (b) inorganic filler, and
wherein said (a) curable resin contains a bisphenol A epoxy resin, a bisphenol A brominated epoxy resin and a novolak phenolic resin.

2. A composite material formed through stacking one or more of the intermediate layer materials according to claim 1, superposing one or more surface layers over both front and back sides of said intermediate layer materials stacked; and curing the structure thus formed.

3. The composite material according to claim 2, having such properties as:
(iii) a planar linear expansion coefficient (α1) equal to or lower than 20 ppm/° C., in a range equal to or higher than 25° C. and equal to or lower than a glass transition temperature (Tg); and
(iv) an elastic modulus equal to and higher than 8,000 MPa and equal to or lower than 20,000 MPa, at 25° C.

* * * * *